(12) United States Patent
Nelson et al.

(10) Patent No.: US 10,186,484 B2
(45) Date of Patent: Jan. 22, 2019

(54) METAL ON BOTH SIDES WITH CLOCK GATED-POWER AND SIGNAL ROUTING UNDERNEATH

(71) Applicant: Intel Corporation, Santa Clara, CA (US)

(72) Inventors: Donald W. Nelson, Beaverton, OR (US); Patrick Morrow, Portland, OR (US); Kimin Jun, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 15/122,913

(22) PCT Filed: Sep. 27, 2014

(86) PCT No.: PCT/US2014/057920
§ 371 (c)(1),
(2) Date: Aug. 31, 2016

(87) PCT Pub. No.: WO2015/195152
PCT Pub. Date: Dec. 23, 2015

(65) Prior Publication Data
US 2017/0077030 A1 Mar. 16, 2017

Related U.S. Application Data

(60) Provisional application No. 62/012,822, filed on Jun. 16, 2014.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76838* (2013.01); *H01L 24/14* (2013.01);
(Continued)

(58) Field of Classification Search
CPC .......... H01L 23/5283; H01L 21/76838; H01L 24/14
See application file for complete search history.

(56) References Cited

U.S. PATENT DOCUMENTS 8,004,085 B2   8/2011  Yamamichi et al.
2006/0012029 A1  1/2006  Kikuchi et al.
(Continued)

FOREIGN PATENT DOCUMENTS

JP   2007335888 A   12/2007
JP   2009-054760   3/2009
(Continued)

OTHER PUBLICATIONS

Intel Corporation, "Office Action", TW Application No. 104114137, (dated Mar. 29, 2016).
(Continued)

*Primary Examiner* — Moazzam Hossain
*Assistant Examiner* — Warren H Kilpatrick
(74) *Attorney, Agent, or Firm* — Schwabe, Williamson & Wyatt P.C.

(57) ABSTRACT

A method including forming a plurality of first interconnects and a plurality of second interconnects on opposite sides of an integrated circuit device layer including a plurality of circuit devices, wherein the plurality of second interconnects include interconnects of different dimensions; and forming contact points to the second plurality of interconnects, the contact points operable for connection to an external source. An apparatus including a substrate including a plurality of first interconnects and a plurality of second interconnects on opposite sides of an integrated circuit device layer including a plurality of circuit devices, wherein the plurality of second interconnects include interconnects of different dimensions;

(Continued)

and contact points coupled to the second plurality of interconnects, the contact points operable for connection to an external source.

8 Claims, 6 Drawing Sheets

(51) Int. Cl.
    *H01L 23/00*     (2006.01)
    *H01L 29/78*     (2006.01)

(52) U.S. Cl.
    CPC .... *H01L 29/78* (2013.01); *H01L 2224/16225* (2013.01); *H01L 2224/16235* (2013.01); *H01L 2924/0002* (2013.01)

(56) References Cited

U.S. PATENT DOCUMENTS

| | | |
|---|---|---|
| 2006/0115943 A1 | 6/2006 | Koyanagi |
| 2008/0277778 A1 | 11/2008 | Furman et al. |
| 2010/0081232 A1* | 4/2010 | Furman ............... H01L 21/2007 438/107 |
| 2010/0117228 A1 | 5/2010 | Yamamichi et al. |
| 2013/0037795 A1 | 2/2013 | Sunamura et al. |
| 2013/0228935 A1 | 9/2013 | Terui et al. |
| 2013/0302943 A1 | 11/2013 | Chandrasekaran et al. |

FOREIGN PATENT DOCUMENTS

| | | |
|---|---|---|
| JP | 2011187473 A | 9/2011 |
| JP | 2001-244267 | 9/2013 |
| TW | 201039439 | 11/2010 |

OTHER PUBLICATIONS

Intel Corporation et al., "International Search Report and Written Opinion", PCT/US2014/057920, (dated Mar. 6, 2015), 14 pages.

Intel Corporation, "International Preliminary Report on Patentability and Written Opinion", PCT/US2014/057920, (dated Dec. 20, 2016).

Intel Corporation, "Office Action", VN Application No. 1-2016-04314, (dated Dec. 30, 2016).

Search Report and Written Opinion for European Search Report, dated Feb. 14, 2018, 8 pages.

Office Action from Japanese Patent Application No. 2016-566678 dated Jul. 17, 2018, 5 pages.

* cited by examiner

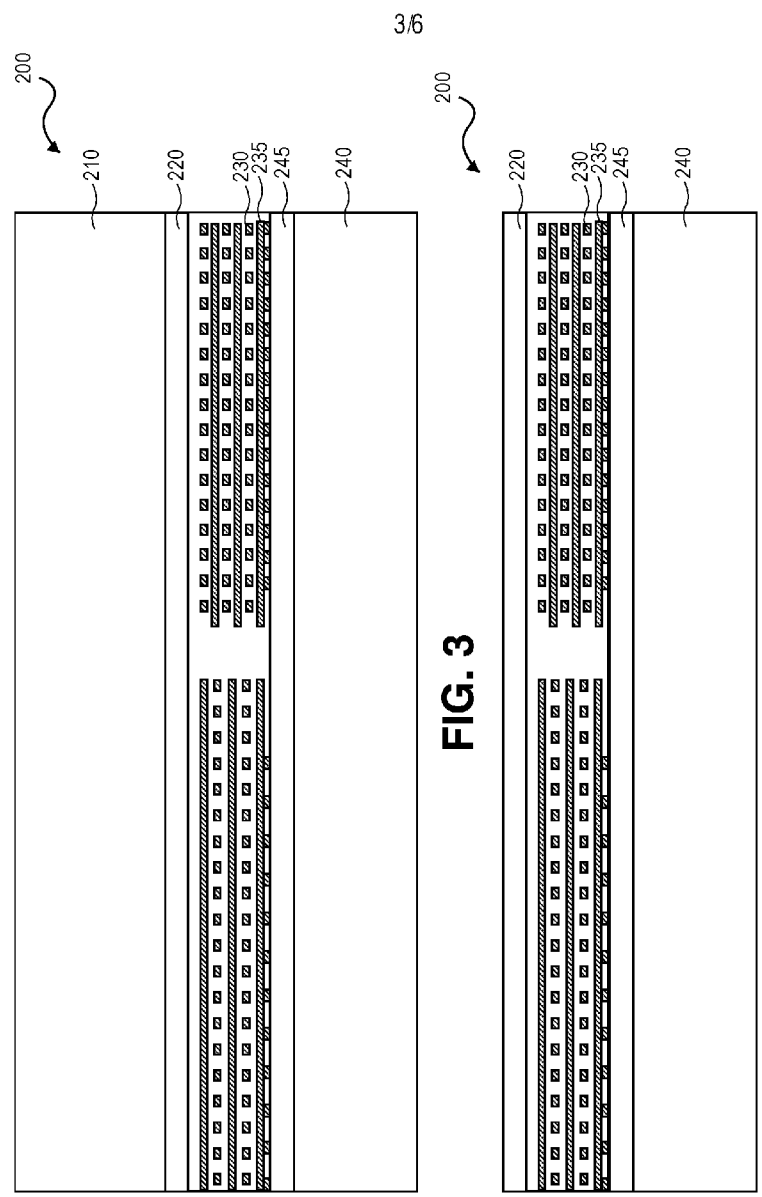

METAL ON BOTH SIDES WITH CLOCK GATED-POWER AND SIGNAL ROUTING UNDERNEATH

CROSS-REFERENCE TO RELATED APPLICATION

This patent application is a U.S. National Phase Application under 35 U.S.C. § 371 of International Application No. PCT/US2014/057920, filed Jun. 16, 2016, entitled METAL ON BOTH SIDES WITH CLOCK GATED POWER AND SIGNAL ROUTING UNDERNEATH.

Thus application claims the benefit of the earlier filing date of U.S. Provisional Patent Application No. 62/012,822, filed Jun. 16, 2014, and incorporated herein by reference.

BACKGROUND

Field

Integrated circuits and more particularly, monolithic three-dimensional integrated circuits.

Description of Related Art

Monolithic integrated circuits (ICs) generally include a number of transistors, such as metal oxide semiconductor field effect transistors (MOSFETs) fabricated over a planar substrate, such as a silicon wafer. Lateral scaling of IC dimensions is becoming more difficult with MOSFETs gate dimensions now below 20 nm. As device sizes continue to decrease, there will come a point where it becomes impractical to continue standard planar scaling. This inflection point could be due to economics or physics, such as prohibitively high capacitance, or quantum-based variability. Stacking of devices in a third dimension, typically referred to as vertical scaling, or three-dimensional (3D) integration, is a promising path toward greater transistor density.

BRIEF DESCRIPTION OF THE DRAWINGS

FIG. 3 shows the structure of FIG. 2 following the connection of the structure to a carrier wafer.

FIG. 4 shows the structure of FIG. 3 following the removal of a portion of the substrate from the structure.

DETAILED DESCRIPTION

Figure 1:
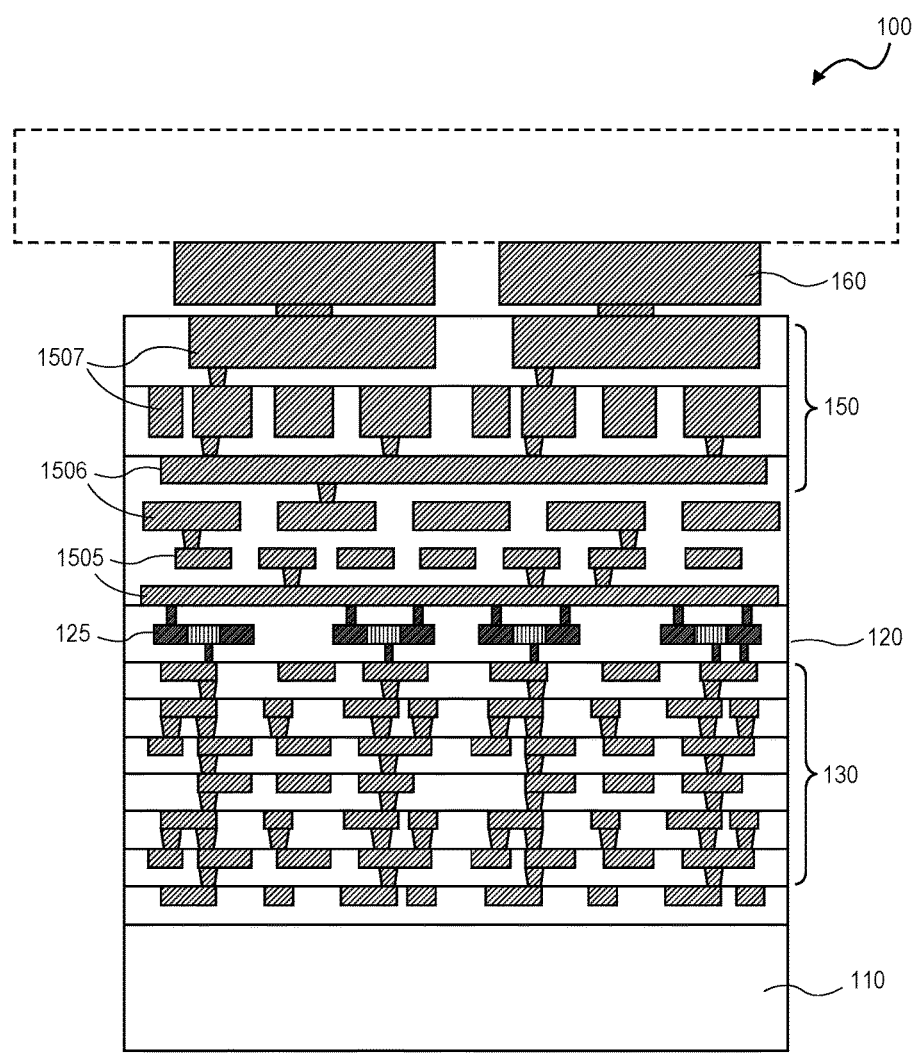
FIG. 1 shows one embodiment of a monolithic 3D IC including memory devices embedded in an interconnect region.

An integrated circuit (IC) and a method of forming and using an IC are disclosed. In one embodiment, a monolithic three-dimensional (3D) IC and its method of manufacture and use is described that, in one embodiment, includes a plurality of first interconnects and a plurality of second interconnects on opposite sides of a device layer wherein the plurality of second interconnects have a dimension (e.g., thickness dimension) that reflects a volume of a particular interconnect that, in one embodiment, is selected for a function, purpose or operation fulfilled by the interconnect (e.g., power distribution, global clock distribution, device layer access). In one embodiment, a dimension of an interconnect of the plurality of second interconnects relates to its position relative to the device layer and such dimension increases from an initial of the plurality of second interconnects to an ultimate of the second plurality of interconnects.

In the following description, various aspects of the illustrative implementations will be described using terms commonly employed by those skilled in the art to convey the substance of their work to others skilled in the art. However, it will be apparent to those skilled in the art that embodiments may be practiced with only some of the described aspects. For purposes of explanation, specific numbers, materials and configurations are set forth in order to provide a thorough understanding of the illustrative implementations. However, it will be apparent to one skilled in the art that the embodiments may be practiced without the specific details. In other instances, well-known features are omitted or simplified in order not to obscure the illustrative implementations.

Various operations will be described as multiple discrete operations, in turn, in a manner that is most helpful in understanding the embodiments described herein, however, the order of description should not be construed to imply that these operations are necessarily order dependent. In particular, these operations need not be performed in the order of presentation.

Implementations may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate such as in device layers as will be noted herein. In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations, the gate electrode may consist of a combination of U-shaped structures and planar, non-U-shaped structures. For example, the gate electrode may consist of one or more U-shaped metal layers formed atop one or more planar, non-U-shaped layers.

In some implementations, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 shows one embodiment of a monolithic 3D IC. Referring to FIG. 1, structure 100 includes substrate 110 that is, for example, a single crystal semiconductor substrate (e.g., single crystal silicon). Substrate 110 includes device layer 120 that, in this embodiment, includes a number of devices 125 (e.g., transistor devices). In one embodiment, devices 125 are generally low power range, state of the art, typically fast devices including logic devices such as FinFETs or other reduced formfactor devices that can generally be arranged on a device layer at a higher pitch than higher voltage range devices.

In the embodiment illustrated in FIG. 1, device layer 120 is disposed between plurality of first interconnects 130 and plurality of second interconnects 150. In one embodiment, one or more devices in device layer 120 is connected to one or both of interconnects associated with plurality of first interconnects 130 and plurality of second interconnects 150 and/or one or more interconnects of plurality of first interconnects 130 and plurality of second interconnects 150 are connected through device layer 120.

Plurality of first interconnects 130 include interconnects connected to one of devices 125 in device layer 120. In one embodiment, plurality of interconnects 130 each has a dimension (e.g., thickness) selected to accommodate, for example, an impedance load associated with devices 125 in device layer 120.

Plurality of second interconnects 150, in one embodiment, are interconnects of different dimensions (volumes) relative to a function, purpose or operation of the interconnect. In one embodiment, plurality of second interconnects 150 include interconnects of different dimensions relative to a position of a respective interconnect to the device layer. FIG. 1 shows interconnects 1505 having a dimension (e.g., a thickness dimension) selected for accessing devices 125 in device layer 120 (e.g., selected to accommodate the impedance of an electrical load associated with devices 125). Interconnect 1506 (which also may represent a single interconnect line or multiple levels (layers) of interconnects) has a dimension (e.g., thickness dimension) selected, in one embodiment, to contain global clock distribution and, in another embodiment, some specialized bus wires that may require either shielding by routing next to $V_{cc}/V_{ss}$, and a lower RC path than is available in device layer 130. Interconnect 1507 (which may represent one or multiple levels (layers) of interconnect) has a dimension (e.g., thickness) selected to globally distribute power ($V_{cc}$), ground ($V_{ss}$) coming from contact points from a package/board or other substrate, as well as to distribute gated power ($V_{ccg}$) and gated ground ($V_{ssg}$) derived by power-gate structures in device layer 120 or elsewhere in structure 100 and then back down to devices 125 in gated power and gated ground regions. As illustrated in FIG. 1, initial interconnect 1505 has a thickness, $t_1$; interconnect 1506 has a thickness, $t_2$; and ultimate interconnect 1507 has a thickness, $t_3$ and $t_3 > t_2 > t_1$. Representatively, in one embodiment, interconnect 1505 has a thickness on the order of at least 0.67 times a gate pitch, interconnect 1506 has a thickness more than 100 times interconnect 1505 and interconnect 1507 has a thickness more than 10 times the thickness of interconnect 1506.

Structure 100 in FIG. 1 also shows contact points operable to connect the structure to a separate substrate such as a package substrate or a board. FIG. 1 shows contact points 160 that are, for example, controlled collapse chip connection (C4) connections operable to connect the structure to external circuitry with solder connections. FIG. 1 representatively shows structure 100 connected to a substrate such as a package substrate through contact points 160, the substrate shown in ghost lines.

Figure 2:
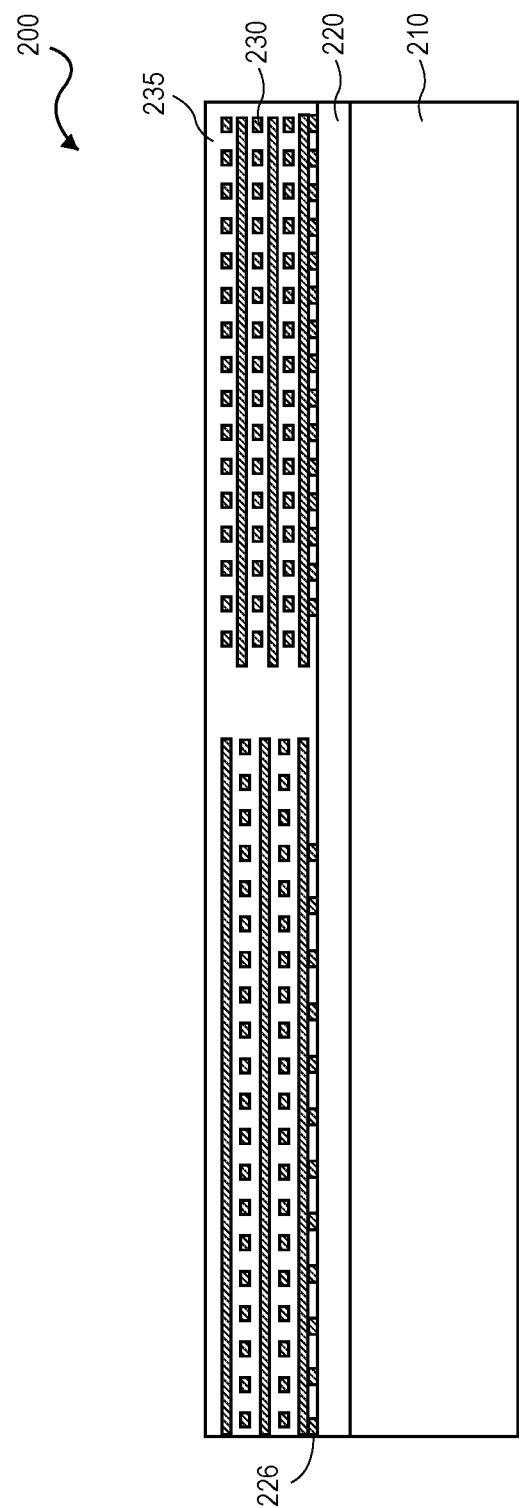
FIG. 2 shows a cross-sectional side view of an embodiment of a structure including a device layer or a substrate and a plurality of first interconnects juxtaposed to the device layer.

FIGS. 2-6 describe one method of forming a monolithic 3D IC. FIG. 2 shows substrate 210 of, for example, a single crystal semiconductor substrate (e.g., a silicon substrate). Disposed on substrate 210 is device layer 220 including, in one embodiment, an array or arrays of high pitch, fast devices, such as FinFETs or other state of art transistor devices. FIG. 2 also shows plurality of interconnects 230 juxtaposed to or on device layer 220. Ones of plurality of interconnects 230 are connected to ones of devices in device layer 220 through, for example, contacts 226. In one embodiment, plurality of interconnects 230 are a copper material patterned as known in the art. Device layer contacts (e.g., contacts 226) between circuit devices and a first level interconnect may representatively be a tungsten or copper material and inter level contacts between interconnects are, for example, a copper material. The interconnects are insulated from one another and from the devices by dielectric materials such as an oxide. FIG. 2 shows dielectric layer 235 juxtaposed to or disposed on an ultimate level of plurality of interconnects 230 (as viewed).

FIG. 3 shows the structure of FIG. 2 following the connection of the structure to a carrier wafer. In one embodiment, structure 200 from FIG. 2 is inverted and bonded to a carrier wafer. FIG. 3 shows carrier wafer 240 of, for example, a silicon or ceramic or other suitable substrate. Overlying a surface of carrier wafer 240, in one embodiment, is dielectric material layer 245 of, for example, an oxide. FIG. 3 shows the bonding through the dielectric materials (dielectric bond) and illustrates plurality of interconnects 230 juxtaposed to carrier wafer 240.

FIG. 4 shows the structure of FIG. 3 following the removal of a portion of substrate 210 from the structure. In one embodiment, a portion of substrate 210 is removed to expose device layer 220. Substrate 210 may be removed by mechanical (e.g., grinding) or other mechanism (e.g., etch). FIG. 4 shows device layer 220 including an exposed top surface of the structure (as viewed).

Figure 5:
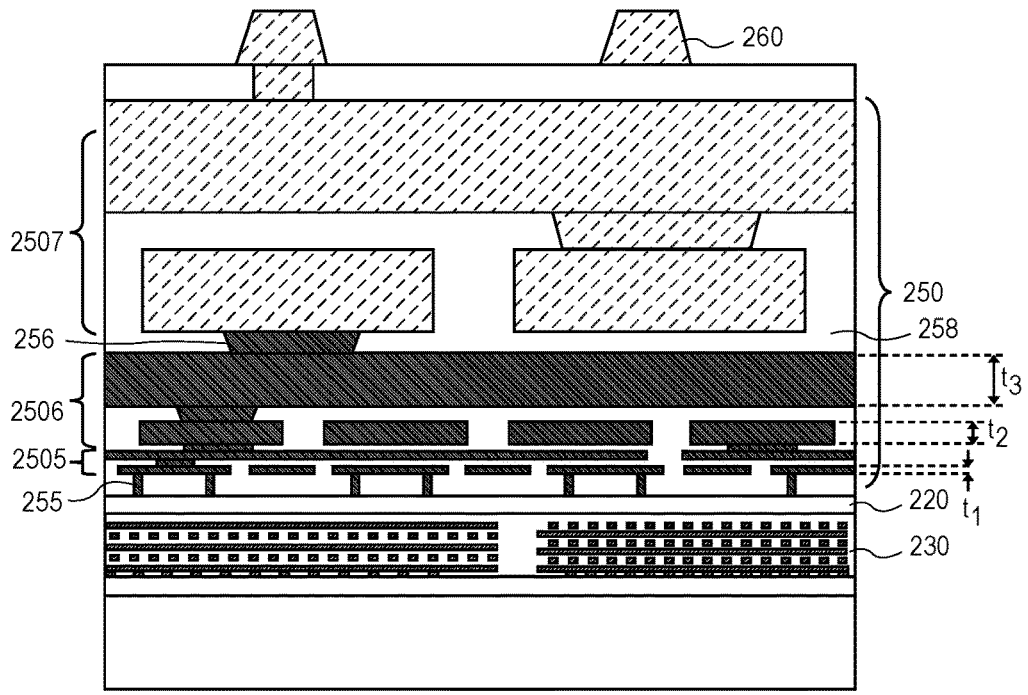
FIG. 5 shows a first cross-sectional side view of the structure of FIG. 4 following the introduction of a plurality of second interconnects on a side of the device layer opposite the first plurality of interconnects.
Figure 6:
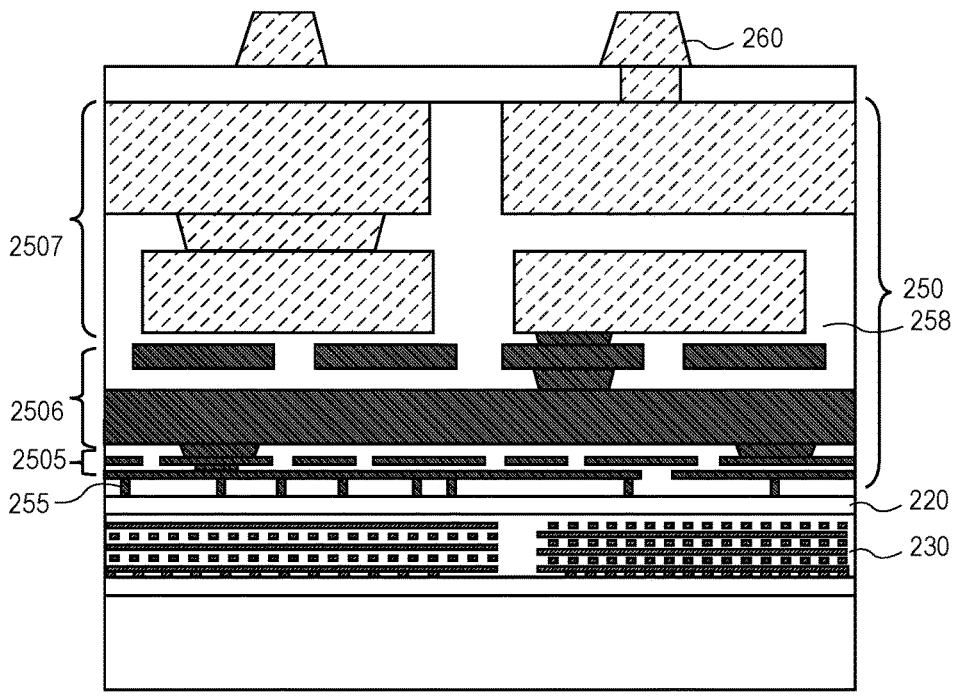
FIG. 6 shows a second cross-sectional side view of the structure of FIG. 4 following the introduction of a plurality of second interconnects on a side of the device layer opposite the first plurality of interconnects.

FIG. 5 and FIG. 6 show first and second side views of the structure of FIG. 4 following the introduction of plurality of interconnects 250 on the structure. As illustrated, a surface of device layer 220 juxtaposed to plurality of interconnects 250 is passivated. In one embodiment, plurality of interconnects 250 have a dimension selected for a function, purpose or operation of the interconnect and the different ones of plurality of interconnects 250 are selected to perform different functions or operations. In one embodiment, ones of plurality of interconnects 250 have a different dimension (volume) relative to a position of the interconnect with respect to device layer 220. FIG. 5 shows plurality of interconnects 250 having interconnects of three different thickness dimensions denoted interconnects 2505 ($t_1$); interconnects 2506 ($t_2$); and interconnects 2507 ($t_3$). Interconnects 2507 define the ultimate interconnects in the interconnect stack (ultimate with respect to a position relative to the device layer). Interconnects 2507 (two shown arranged orthogonally with respect to one another) have a thickness dimension that is relatively larger than a thickness dimension of interconnects 2506 or interconnects 2505 ($t_3 > t_2 > t_1$). In one embodiment, interconnects 2507 have a dimension (e.g., thickness) to define a volume for an interconnect whose function is to form a grid to globally distribute power ($V_{cc}$), ground ($V_{ss}$) coming from contact points connected to an external device such as a package or board (contact points 260). Interconnects 2507 also function to distribute power ($V_{ccg}$) and gated ground ($V_{ssg}$) derived by power gate structures in device layer 220 or elsewhere in the structure and back down to devices in gated power and gated ground regions (e.g., devices in device layer 220).

Interconnects 2506 (two interconnect layers or levels shown arranged orthogonally with respect to one another) are disposed below interconnects 2507 (as viewed). Interconnects 2506 have a dimension (e.g., thickness) to define a volume that is less than a volume of interconnects 2507. In one embodiment, dimensions of interconnects 2506 are selected to fulfill a function to further locally grid power supplies and to contain global clock distribution and any specialized bus wires that require either shielding by routing next to $V_{cc}/V_{ss}$, and/or a lower RC path than is available in the interconnect routing in plurality of interconnects 230.

Interconnects 2505 in plurality of interconnects 250 (two interconnect layers or levels shown) are located below interconnects 2506 (as viewed) and in one embodiment define an initial or the initial interconnect line(s) or level(s) relative to device layer 220. Interconnects 2505 have a dimension (e.g., thickness) defining a volume selected for distribution of signals gridded in interconnects 2506 down to pitches needed to access devices (e.g., transistors) via contacts 255 (either to the source/drain of the devices or through an active device layer to interconnect on an opposite side of device layer 220).

Plurality of interconnects 250 are selected, in one embodiment, from a material such as copper introduced by a plating process. FIG. 5 shows contacts 255 between device layer 220 (or through device layer 220) and interlevel contact 256. Since contacts may also be copper and formed through a plating process or, particularly in the case of contacts 255, may be another material such as a tungsten material. FIG. 5 also shows plurality of interconnects 250 insulated from one another by dielectric material 258 of, for example, an oxide.

The actual layouts of plurality of interconnects 250 relative to each layer are, in one embodiment, circuit dependent both on power delivery requirements as well as the need to distribute clocks (gated and ungated) to tap points, as well as local busses and signals requiring lower RC values for a distance traveled. In one embodiment, each of the pairs of interconnects 2505, 2506 and 2507 form a grid pattern to minimize IR (resistive power) drop. In addition, separating interconnects on opposite sides of device layer 220 enables high volume e-beam manufacturing with limited numbers of uniform matched metal pitches in a signal interconnect region.

In the above description and associated drawings, interconnects are illustrated as generally rectangular in cross-section and described as having a different thickness dimension indicated representatively as a height measured in a vertical direction as viewed in the Figures (e.g., FIG. 5, FIG. 6). It is appreciated that to modify a volume of an interconnect, a dimension other than the identified height may be changed. It is also envisioned that an interconnect may have a shape other than rectangular in cross-section. Thus, as used herein, the word "thickness" encompasses a height or width for a rectangularly-shaped body (measured in a horizontal direction across the page in the Figures) and other volume-modifying direction for other shapes (e.g., diameter for circular cross-sectional shape).

Figure 7:
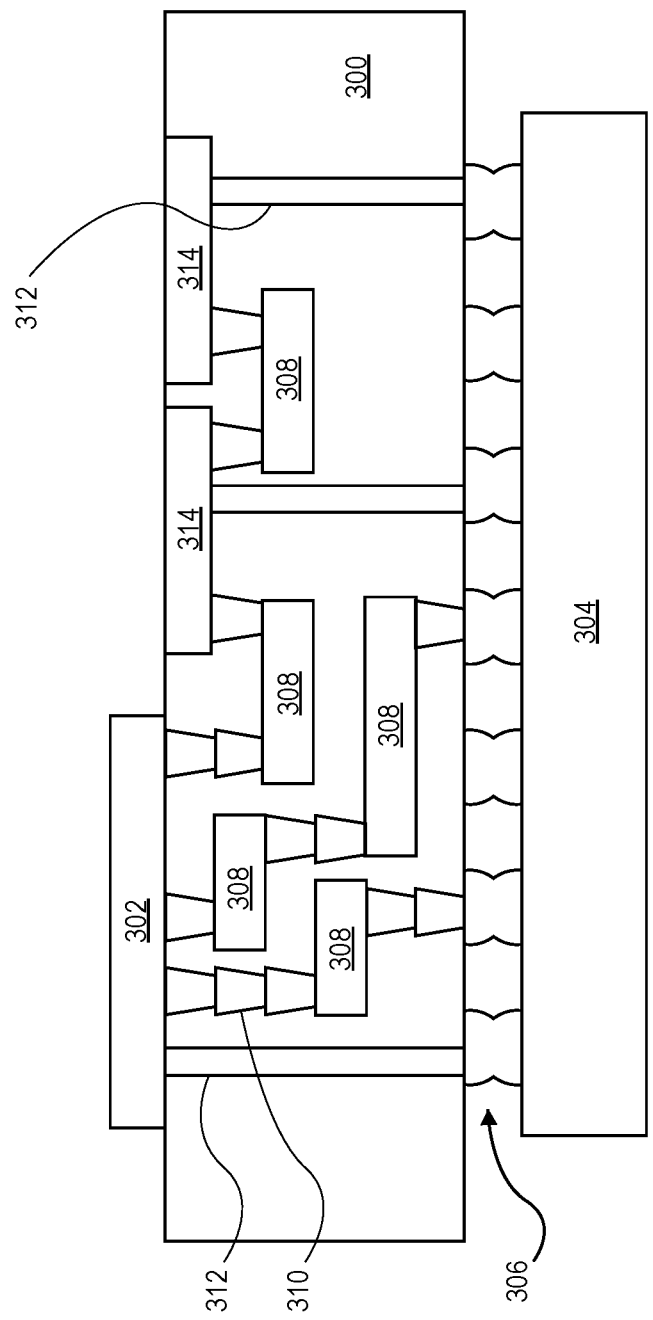
FIG. 7 is an interposer implementing one or more embodiments.

FIG. 7 illustrates an interposer 300 that includes one or more embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300.

In accordance with embodiments, apparatuses or processes disclosed herein may be used in the fabrication of interposer 300.

Figure 8:
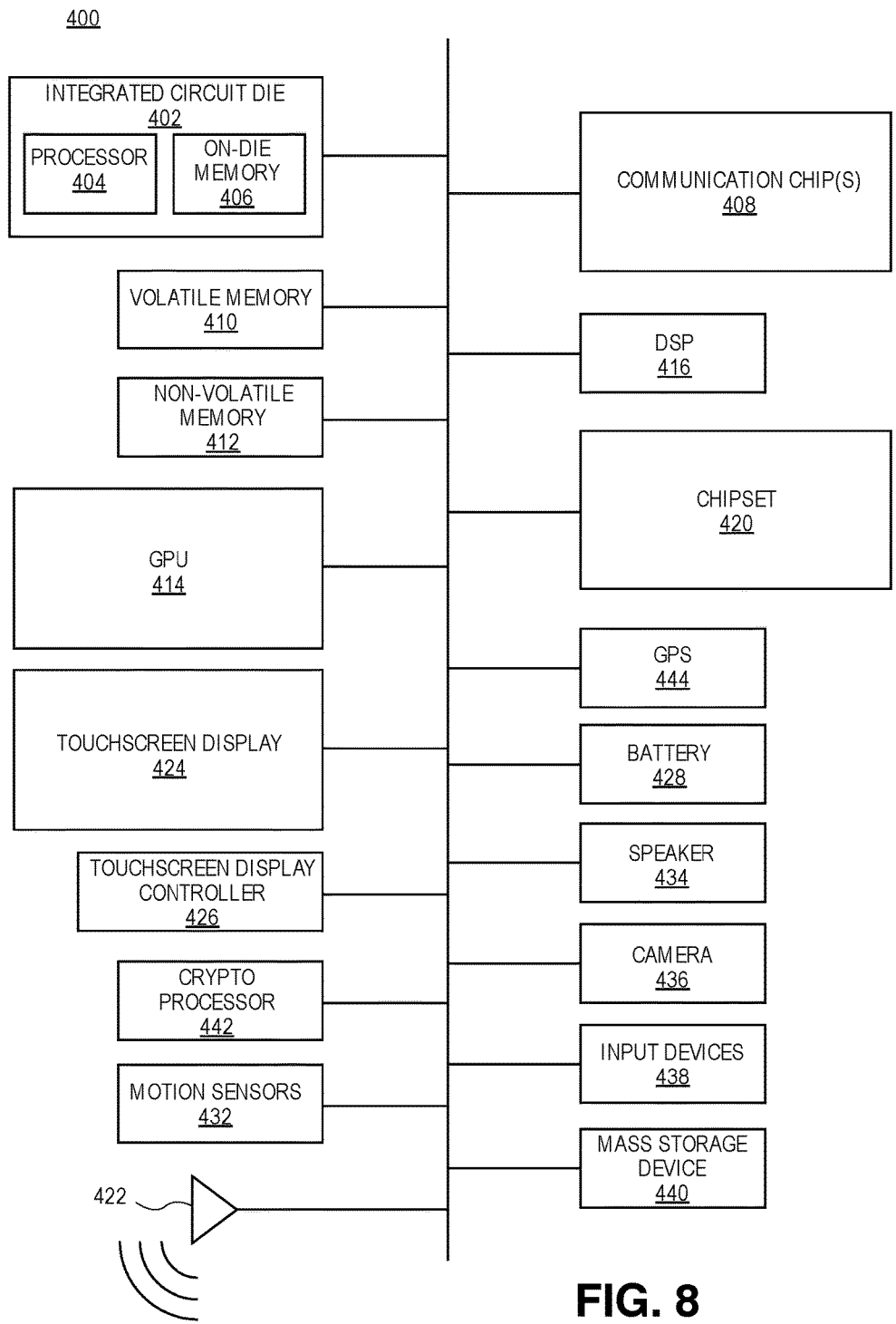
FIG. 8 illustrates an embodiment of a computing device.

FIG. 8 illustrates a computing device 400 in accordance with one embodiment of the invention. The computing device 400 may include a number of components. In one embodiment, these components are attached to one or more motherboards. In an alternate embodiment, these components are fabricated onto a single system-on-a-chip (SoC) die rather than a motherboard. The components in the computing device 400 include, but are not limited to, an integrated circuit die 402 and at least one communication chip 408. In some implementations the communication chip 408 is fabricated as part of the integrated circuit die 402. The integrated circuit die 402 may include a CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), graphics processing unit 414 (GPU), digital signal processor 416, crypto processor 442 (a specialized processor that executes cryptographic algorithms within hardware), chipset 420, antenna 422, display or a touchscreen display 424, touchscreen controller 426, battery 428 or other power source, a power amplifier (not shown), global positioning system (GPS) device 444, compass 430, motion coprocessor or sensors 432 (that may include an accelerometer, a gyroscope, and a compass), speaker 434, camera 436, user input devices 438 (such as a keyboard, mouse, stylus, and touchpad), and mass storage device 440 (such as hard disk drive, compact disk (CD), digital versatile disk (DVD), and so forth).

Communications chip 408 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 408. For instance, a first communication chip 408 may be dedicated to shorter range wireless communications such as Wi-Fi and Bluetooth and a second communication chip 408 may be dedicated to longer range wireless communications such as GPS, EDGE, GPRS, CDMA, WiMAX, LTE, Ev-DO, and others.

The processor 404 of the computing device 400 includes a monolithic 3D IC including an interconnect region (with interconnects having a dimension selected for an intended purpose, function or operation), that are formed in accordance with embodiments described above. The term "processor" may refer to any device or portion of a device that processes electronic data from registers and/or memory to transform that electronic data into other electronic data that may be stored in registers and/or memory.

The communication chip 408 may also include a monolithic 3D IC including an interconnect region (with interconnects having a dimension selected for an intended purpose, function or operation), that are formed in accordance with embodiments described above.

In further embodiments, another component housed within the computing device 400 may contain a monolithic 3D IC including an interconnect region (with interconnects having a dimension selected for an intended purpose, function or operation), that are formed in accordance with implementations described above.

EXAMPLES

Example 1 is a method including forming a plurality of first interconnects and a plurality of second interconnects on opposite sides of an integrated circuit device layer comprising a plurality of circuit devices, wherein the plurality of second interconnects include interconnects of different dimensions; and forming contact points to the second plurality of interconnects, the contact points operable for connection to an external source.

In Example 2, a first of the plurality of second interconnects in the method of Example 1 have dimensions selected for accessing devices in the device layer and a second of the plurality of second interconnects comprises a thickness dimension greater than the first of the plurality of second interconnects wherein such dimension is selected to contain global clock distribution.

In Example 3, a third of the plurality of second interconnects in the method of Example 2 have dimensions selected for distributing power.

In Example 4, the third of the plurality of second interconnects in the method of Example 3 are coupled to externally accessible contact points.

In Example 5, the second of the plurality of second interconnects in the method of Example 2 is disposed between the first plurality of second interconnects and the third plurality of second interconnects.

In Example 6, the plurality of second interconnects in the method of Example 3 have a dimension that relative to a position of the device layer increases from the first of the plurality of second interconnects to the third of the second plurality of second interconnects.

In Example 7, ones of the plurality of first interconnects in the methods of Examples 1 or 2 are connected to respective devices in the integrated circuit device layer.

In Example 8, the interconnects of different dimensions in the methods of Examples 1 or 2 include interconnects of different thickness dimensions.

In Example 9, an integrated circuit device formed by any of the methods of Examples 1 or 2.

Example 10 is a method including forming a plurality of first interconnects and a plurality of second interconnects on opposite sides of an integrated circuit device layer comprising a plurality of circuit devices, wherein ones of the plurality of first interconnects are connected to respective devices in the integrated circuit device layer and the plurality of second interconnects have a dimension that relative to a position of the device layer increases from an initial of the plurality of second interconnects to an ultimate of the second plurality of second interconnects; and forming contact points to the second plurality of interconnects, the contact points operable for connection to an external source.

In Example 11, an initial of the plurality of second interconnects in the method of Example 10 have dimensions selected for accessing devices in the device layer.

In Example 12, the plurality of second interconnects in the method of Example 11 includes a second of the plurality of second interconnects includes a thickness dimension greater than the initial of the plurality of second interconnects wherein such dimension is selected to contain global clock distribution.

In Example 13, the ultimate of the plurality of second interconnects in the method of Example 12 have dimensions selected for distributing power.

In Example 14, the ultimate of the plurality of second interconnects in the method of Example 12 are coupled to externally accessible contact points.

In Example 15, the dimension of the second of the plurality of second interconnects in the methods of Examples 10 or 11 is a thickness dimension.

In Example 16, an integrated circuit device formed by any of the methods of Examples 10 or 11.

Example 17 is an apparatus including a substrate comprising a plurality of first interconnects and a plurality of second interconnects on opposite sides of an integrated circuit device layer including a plurality of circuit devices, wherein the plurality of second interconnects include interconnects of different dimensions; and contact points coupled to the second plurality of interconnects, the contact points operable for connection to an external source.

In Example 18, the plurality of second interconnects of the apparatus of Example 17 have a dimension that relative to a position of the device layer increases from a first of the plurality of second interconnects to an ultimate of the first plurality of second interconnects.

In Example 19, the dimension of the apparatus of Example 18 is a thickness dimension.

In Example 20, a first of the plurality of second interconnects of the apparatus of Example 19 have dimensions selected for accessing devices in the device layer and a second of the plurality of second interconnects includes a thickness dimension greater than the first of the plurality of second interconnects wherein such dimension is selected to contain global clock distribution.

In Example 21, a third of the plurality of second interconnects of the apparatus of Example 20 have dimensions selected for distributing power.

In Example 22, the second of the plurality of second interconnects of the apparatus of Example 21 is disposed between the first plurality of second interconnects and the third plurality of second interconnects.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:
1. A method comprising:
    forming a plurality of first interconnects and a plurality of second interconnects on opposite sides of an integrated circuit device layer comprising a plurality of circuit devices, wherein the plurality of second interconnects include interconnects of different dimensions, wherein a first of the plurality of second interconnects have dimensions selected for accessing devices in the device layer and a second of the plurality of second interconnects comprises a thickness dimension greater than the first of the plurality of second interconnects wherein such dimension is selected to contain global clock distribution, wherein a third of the plurality of second interconnects have dimensions selected for distributing power, and wherein the third of the plurality of second interconnects comprises a thickness dimension greater than the second of the plurality of second interconnects; and forming contact points to the second plurality of interconnects, the contact points operable for connection to an external source.

2. The method of claim 1, wherein the third of the plurality of second interconnects are coupled to externally accessible contact points.

3. The method of claim 1, wherein the second of the plurality of second interconnects is disposed between the first of the plurality of second interconnects and the third of the plurality of second interconnects.

4. The method of claim 1, wherein ones of the plurality of first interconnects are connected to respective devices in the integrated circuit device layer.

5. A method comprising:

forming a plurality of first interconnects and a plurality of second interconnects on opposite sides of an integrated circuit device layer comprising a plurality of circuit devices, wherein ones of the plurality of first interconnects are connected to respective devices in the integrated circuit device layer and the plurality of second interconnects have a dimension that relative to a position of the device layer increases from an initial of the plurality of second interconnects to an ultimate of the second plurality of second interconnects, wherein the initial of the plurality of second interconnects have dimensions selected for accessing devices in the device layer, wherein the plurality of second interconnects comprises a second of the plurality of second interconnects comprising a thickness dimension greater than the initial of the plurality of second interconnects wherein such dimension is selected to contain global clock distribution, wherein the ultimate of the plurality of second interconnects have dimensions selected for distributing power, and wherein the ultimate of the plurality of second interconnects comprises a thickness dimension greater than the second of the plurality of second interconnects; and forming contact points to the second plurality of interconnects, the contact points operable for connection to an external source.

6. The method of claim 5, wherein the ultimate of the plurality of second interconnects are coupled to externally accessible contact points.

7. An apparatus comprising:

a substrate comprising a plurality of first interconnects and a plurality of second interconnects on opposite sides of an integrated circuit device layer comprising a plurality of circuit devices, wherein the plurality of second interconnects include interconnects of different dimensions, wherein a first of the plurality of second interconnects have dimensions selected for accessing devices in the device layer and a second of the plurality of second interconnects comprises a thickness dimension greater than the first of the plurality of second interconnects wherein such dimension is selected to contain global clock distribution, wherein a third of the plurality of second interconnects have dimensions selected for distributing power, and wherein the third of the plurality of second interconnects comprises a thickness dimension greater than the second of the plurality of second interconnects; and contact points coupled to the second plurality of interconnects, the contact points operable for connection to an external source.

8. The apparatus of claim 7, wherein the second of the plurality of second interconnects is disposed between the first of the plurality of second interconnects and the third of the plurality of second interconnects.

* * * * *